United States Patent
Weingaertner et al.

(10) Patent No.: US 9,304,156 B2
(45) Date of Patent: Apr. 5, 2016

(54) METHOD FOR MEASURING CAPACITANCE AND CAPACITIVE SENSOR UNIT

(71) Applicant: BROSE FAHRZEUGTEILE GMBH & CO. KG, HALLSTADT, Hallstadt (DE)

(72) Inventors: Thomas Weingaertner, Memmelsdorf (DE); Holger Wuerstlein, Zeil Am Main (DE); Florian Pohl, Ebersdorf (DE)

(73) Assignee: Brose Fahrzeugteile GmbH & Co. KG, Hallstadt, Hallstadt (DE)

( * ) Notice: Subject to any disclaimer, the term of this patent is extended or adjusted under 35 U.S.C. 154(b) by 140 days.

(21) Appl. No.: 13/962,234

(22) Filed: Aug. 8, 2013

(65) Prior Publication Data
US 2013/0321006 A1   Dec. 5, 2013

Related U.S. Application Data

(63) Continuation of application No. PCT/EP2012/000463, filed on Feb. 2, 2012.

(30) Foreign Application Priority Data

Feb. 8, 2011   (DE) .................. 10 2011 010 620

(51) Int. Cl.
*G01R 27/26* (2006.01)
*B60R 25/20* (2013.01)
*H03K 17/955* (2006.01)
(Continued)

(52) U.S. Cl.
CPC ........ *G01R 27/2605* (2013.01); *B60R 25/2054* (2013.01); *H03K 17/955* (2013.01); *E05F 15/46* (2015.01); *E05F 15/73* (2015.01); *E05Y 2400/852* (2013.01); *E05Y 2400/858* (2013.01); *E05Y 2900/50* (2013.01); *E05Y 2900/546* (2013.01); *H03K 2217/960715* (2013.01); *H03K 2217/960725* (2013.01)

(58) Field of Classification Search
CPC ............... G01R 27/2605; G01R 27/26; B60R 25/2054; B60R 25/2045; H03K 17/955; H03K 17/962; G01D 5/24
See application file for complete search history.

(56) References Cited

U.S. PATENT DOCUMENTS

| 5,730,165 A | 3/1998 | Philipp |
| 6,452,514 B1 | 9/2002 | Philipp |

(Continued)

FOREIGN PATENT DOCUMENTS

| CN | 1579849 A | 2/2005 |
| DE | 69920034 T2 | 8/2005 |

(Continued)

*Primary Examiner* — Tung X Nguyen
*Assistant Examiner* — David Frederiksen
(74) *Attorney, Agent, or Firm* — Laurence A. Greenberg; Werner H. Stemer; Ralph E. Locher

(57) ABSTRACT

A method measures a capacitance. According to the method, a first detection measurement for the capacitance which is to be measured is detected by a first measurement method during a first measurement phase. In this case, a second measurement phase is started when the first detection measurement satisfies a transition criterion. A second detection measurement for the capacitance which is to be measured is detected during the second measurement phase by a second measurement method which differs from the first measurement method. The second measurement method has higher measurement accuracy than the first measurement method but also greater energy expenditure.

7 Claims, 2 Drawing Sheets

(51) Int. Cl.
*E05F 15/46* (2015.01)
*E05F 15/73* (2015.01)

(56) References Cited

U.S. PATENT DOCUMENTS

| | | | |
|---|---|---|---|
| 6,466,036 B1 | 10/2002 | Philipp | |
| 7,205,777 B2 | 4/2007 | Schulz et al. | |
| 7,245,131 B2 | 7/2007 | Kurachi et al. | |
| 7,652,487 B2 | 1/2010 | Schulz et al. | |
| 2003/0132763 A1 | 7/2003 | Ellenz | |
| 2003/0216817 A1* | 11/2003 | Pudney | 700/17 |
| 2006/0250142 A1* | 11/2006 | Abe | 324/663 |
| 2008/0012581 A1 | 1/2008 | Schulz et al. | |
| 2009/0027068 A1* | 1/2009 | Philipp et al. | 324/678 |
| 2009/0033343 A1 | 2/2009 | Reynolds et al. | |
| 2009/0133510 A1* | 5/2009 | Witte et al. | 73/862.626 |
| 2010/0060489 A1* | 3/2010 | Fasshauer | H03K 17/955 341/20 |
| 2010/0219845 A1* | 9/2010 | Easter | H03K 17/9622 324/678 |
| 2011/0057773 A1* | 3/2011 | Newman et al. | 340/5.72 |
| 2011/0155477 A1* | 6/2011 | Liang | G06F 3/0416 178/18.03 |

FOREIGN PATENT DOCUMENTS

| | | |
|---|---|---|
| DE | 102006029120 A1 | 12/2007 |
| EP | 1505734 A2 | 2/2005 |
| EP | 1686543 A1 | 8/2006 |
| GB | 2451352 A | 1/2009 |

\* cited by examiner

METHOD FOR MEASURING CAPACITANCE AND CAPACITIVE SENSOR UNIT

CROSS-REFERENCE TO RELATED APPLICATION

This is a continuation application, under 35 U.S.C. §120, of copending international application No. PCT/EP2012/000463, filed Feb. 2, 2012, which designated the United States; this application also claims the priority, under 35 U.S.C. §119, of German patent application No. DE 10 2011 010 620.0, filed Feb. 8, 2011; the prior applications are herewith incorporated by reference in their entireties.

BACKGROUND OF THE INVENTION

Field of the Invention

The invention relates to a method for measuring a capacitance and to an associated sensor unit.

The detection of a capacitance or of a change in a capacitance is significant for many fields of application. In motor vehicle engineering, capacitive sensors are used, in particular, frequently as proximity switches, in particular for contactlessly activating a vehicle door or in anti-trapping devices which operate in a contactless fashion.

A method for measuring a capacitance, in particular for the abovementioned purposes of use, is to supply, as desired, a measurement of the capacitance to be measured which is as precise and failsafe as possible. On the other hand, such a method is to permit rapid measurement of a capacitance, in particular in order to permit a sufficiently fast reaction to rapid changes in the capacitance, for example owing to a rapidly approaching body part or object. Finally, such a method is to be capable of being implemented automatically in an energy-saving fashion and with simple measures. With this in mind, it should be, in particular, numerically uncomplicated.

BRIEF SUMMARY OF THE INVENTION

The invention is based on the object of specifying a method for measuring a capacitance which satisfies these requirements particularly well. The invention is also based on the object of specifying a capacitive sensor unit which is particularly suitable for carrying out the method.

With the foregoing and other objects in view there is provided, in accordance with the invention, a method for measuring a capacitance. During a first measuring phase, a first detection measurement of the capacitance to be measured is detected via a first measuring method. A second measuring phase is started when the first detection measurement satisfies a transition criterion. During the second measuring phase, a second detection measurement of the capacitance to be measured is detected via a second measuring method being different from the first measuring method. The second measuring method has a higher level of measuring accuracy compared to the first measuring method, and the first measuring method has a lower expenditure of energy compared to the second measuring method.

According to the method, during a measuring process in which a capacitance and/or a change in capacitance is to be detected, a first and a second measuring phase are differentiated.

During the first measuring phase, a first detection measurement of the capacitance to be measured is determined by a comparatively inaccurate, first measuring method, which is, however, distinguished by comparatively low energy consumption, as a coarse estimation. During the second measuring phase, a second measuring method, which is more precise but involves greater expenditure on energy, is used to determine a second detection measurement for a fine estimate of the capacitance. According to the invention, in this context switching over occurs from the first measuring phase into the second measuring phase when the first detection measurement satisfies a predefined transition criterion.

In one preferred embodiment of the method, during the first measuring phase a measurement of a charging speed of a sensor electrode is detected as a first detection measurement as a coarse estimate of the capacitance to be measured. As an alternative to this, during the first measuring phase an alternating voltage can be applied to a voltage divider which contains the sensor electrode. In this case, the first detection measurement can be acquired from the capacitance-dependent amplitude of the voltage and/or from the phase angle between the voltage and the strength of the flow of current caused by the voltage.

In contrast, during the second measuring phase, a measurement of a charge quantity which is collected at the sensor electrode is preferably detected as a second detection measurement. As an alternative to this, the second detection measurement can also be acquired by determining the frequency of a voltage which is generated by an RC oscillator which contains the sensor electrode.

The capacitive sensor unit according to the invention contains at least one sensor electrode, but can optionally also contain a plurality of sensor electrodes. Furthermore, the sensor unit contains an evaluation unit. In this context, a charging resistor and a reference capacitor can be selectively intermediately connected between the sensor electrode, or each sensor electrode, on the one hand and the evaluation unit on the other. In terms of circuitry and/or programming, the evaluation unit is configured to carry out the method according to the invention.

In one expedient embodiment of the invention, the evaluation unit is formed at least substantially by a microcontroller in which a control program which automatically carries out the method is implemented. However, the control unit can alternatively also be formed, for example, by an application-specific, integrated circuit (ASIC).

As has been recognized, the measuring methods which are respectively applied in the two measuring phases each satisfy only a number of the requirements mentioned above. For example, although, in particular, the determination of the charging speed is advantageously numerically uncomplicated and can therefore be implemented easily and in an energy-saving fashion, it disadvantageously permits only a comparatively inaccurate determination of the capacitance. In addition, it is comparatively susceptible to errors and faults. The determination of the charge quantity permits, on the other hand, a substantially more accurate determination of the capacitance, in a way which is less susceptible to faults. However, the determination is substantially more complex numerically and in terms of process technology. Therefore, for a given power of an automatic device which carries out the method, the determination is slower and involves a greater expenditure of energy.

In the method according to the invention, in the absence of a body part to be detected, therefore typically during the by far greater proportion of the operating time, the measurement of the capacitance takes place on the basis of the energy-saving and resource-saving coarse estimation. Switching over to the relatively accurate fine estimation occurs only as required, specifically if a capacitance with a critical variable (transition criterion) is determined by the coarse estimation. As a result of the dynamic switching over between the measuring phases, the respective advantages of the two measuring methods are therefore utilized synergetically, while the disadvantages thereof are largely suppressed. In particular, the method according to the invention provides a high-resolution capacitance measurement, a high level of insensitivity to faults and robustness when required, together with a short measuring period, low requirements of the computing power and low power consumption during the major part of the operating time.

The transition criterion preferably contains, according to the method, a threshold value comparison of the first detection measurement with a first threshold value. A voltage which drops across the sensor electrode is expediently detected as a first detection measurement. As an alternative to this, the voltage which drops across the charging resistor can also be detected. The transition criterion is satisfied in both cases when the first detection measurement does not reach the associated threshold value in a predefined time frame. In this method step, the sensor electrode is preferably periodically charged and discharged within the scope of the sensor unit. In an expedient embodiment in this context, the evaluation unit measures, after the expiry of a predefined waiting time, the voltage which drops across the sensor electrode or the charging resistor, and compares this voltage with the predefined voltage threshold value. Alternatively, the evaluation unit detects the time of the charging process until the threshold value is reached, and compares this time with a corresponding time threshold value.

In one suitable embodiment of the method, in order to determine the charge quantity of the sensor electrode, charge is transferred from the latter to the reference capacitor and measured there on the basis of the capacitor voltage which builds up during this transfer of charge. The charging at the reference capacitor is increased incrementally here in order to improve the measuring accuracy, preferably by repeated transfer of charge.

In one expedient method variant, after a certain number of increases in charge the capacitor voltage is therefore used in turn as a measurement of the capacitance of the sensor electrode. In one preferred variant of the method, for this purpose the charging at the reference capacitor is accumulated incrementally until the voltage of the reference capacitor exceeds a predefined limiting value. The variable number of charge increasing steps in this case until the limiting value is reached is used here as a measurement of the capacitance. In one alternative embodiment of the method which is equally preferred, during the second measuring phase the capacitor voltage is determined after a strictly predefined number of increases in charge and is evaluated as a measurement of the capacitance.

In one suitable development of the method, changing over alternatively between the first measuring phase and the second measuring phase takes place optionally during the measuring process in a timing pattern, in order to determine a more precisely specified basic value for the capacitance to be measured. The coarse estimation which is carried out in the first measuring phase is therefore calibrated by periodically applied second measuring phases. However, overall the first measuring phase preferably takes up a significantly greater part of the total measuring time.

In one preferred embodiment, the method according to the invention or the associated sensor unit is applied to detect a door opening request of a motor vehicle user for a door of a motor vehicle. In one suitable embodiment of the invention, the evaluation unit of the sensor unit outputs a triggering signal which brings about the actuation of the vehicle door when the evaluation unit detects a door opening request by the vehicle user on the basis of the evaluated sensor signals. The door opening request is intended to be signaled here by a certain body movement of the vehicle user which causes a characteristic change in the capacitance measured by the sensor.

The door to be activated is preferably a vehicle tailgate. In this case, in its intended installation situation the sensor unit is expediently arranged in the rear bumper of the vehicle. If a leg of the vehicle user approaches the bumper, in particular in the form of a kicking movement, the sensor unit transmits a triggering signal which activates the tailgate at a certain value of the capacitance measurement.

However, a use of such a sensor unit is also conceivable for activating other vehicle doors or for contactless protection against trapping for motor-operated closing elements, for example in the case of a vehicle window or a vehicle sunroof. The method according to the invention and the associated sensor unit can additionally also be used for applications outside motor vehicle engineering, for example as proximity sensors or filling level meters in industrial fabrication.

Other features which are considered as characteristic for the invention are set forth in the appended claims.

Although the invention is illustrated and described herein as embodied in a method for measuring a capacitance and a measuring sensor unit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE INVENTION

Corresponding parts and variables are always provided with the same reference symbols in all the figures.

Figure 1:
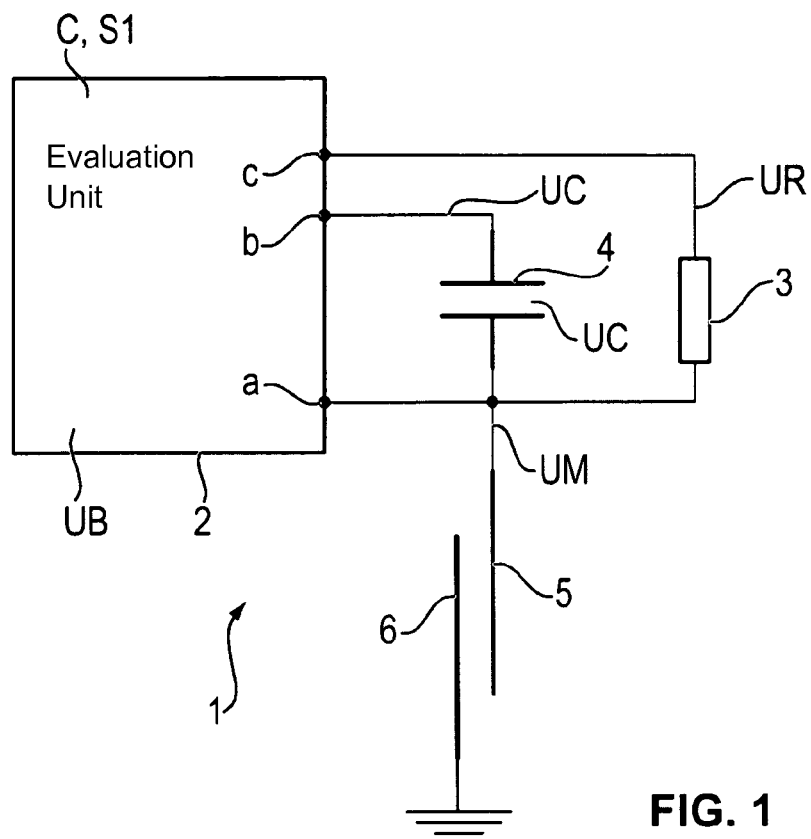
FIG. 1 is a schematic illustration of a capacitive sensor unit for contactlessly activating a vehicle door, having a sensor electrode, an evaluation unit, a charging resistor and a reference capacitor according to the invention.

Referring now to the figures of the drawings in detail and first, particularly to FIG. 1 thereof, there is shown a capacitive sensor unit 1 which has an evaluation unit 2, a charging resistor 3, a reference capacitor 4 and a sensor electrode 5. The evaluation unit 2 has three switchable inputs/outputs (pins a, b and c) via which the resistor 3, the reference capacitor 4 and the sensor electrode 5 are coupled by signaling technology to the evaluation unit 2. In this embodiment, the evaluation unit 2 is formed at least substantially by a microcontroller with control and evaluation software implemented thereon.

The pin a of the evaluation unit 2 is connected in each case to a connecting contact of the reference capacitor 4, of the charging resistor 3 and of the sensor electrode 5. The pins b and c are connected to the other connecting contact of the reference capacitor 4 or to the other connecting contact of the charging resistor 3.

The pins a, b and c are switched over by the evaluation unit 2 to various states during operation in order to carry out the different working processes during the measuring process. Each pin a, b and c can assume one of three states in a reversible fashion, wherein these states are passively characterized by a switchable input resistance ("high impedance"/"low impedance"), and in the low-impedance state by a switchable output potential ("high"/"low").

Figure 2:
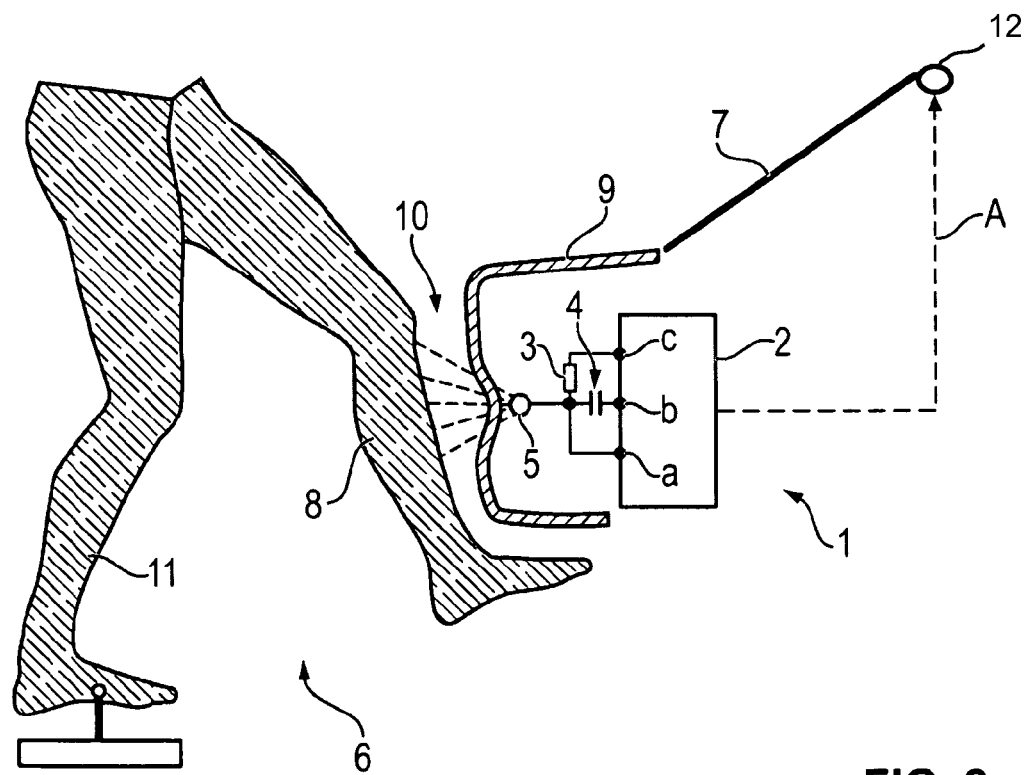
FIG. 2 is a diagrammatic, side view of a motor vehicle bumper, the sensor electrode arranged therein and the evaluation unit coupled thereto, as well as an electrical leakage field which is formed on the sensor electrode.

The sensor unit 1 serves for contactlessly detecting a door opening request of a vehicle user 6 (FIG. 2) and for automatically opening a corresponding vehicle door, here for example a tailgate 7, as soon as such a door opening request is detected by the sensor unit 1. The door opening request to be detected is intended to be signaled here by the vehicle user 6 by virtue of the fact that, according to FIG. 2, the vehicle user 6 moves his leg 8 briefly, in particular in the form of a kicking movement, toward the rear bumper 9 of the vehicle in or on which the sensor electrode 5 is mounted in its intended installation state. In contrast, the evaluation unit 2 is preferably arranged protected against the weather in the dry space of the vehicle bodywork.

During operation of the sensor unit 1, an electrical voltage is applied to the sensor electrode 5 by the evaluation unit 2, under the effect of which voltage an electrical leakage field 10 is generated in a spatial area (detection space) which surrounds the sensor electrode 5.

For the automatic detection of the door opening request by the sensor unit 1, use is made of the physical effect according to which the leg 8 of the vehicle user 6 which is located in the detection space acts as an opposing electrode corresponding to the sensor electrode 5 owing to the electrical conductivity of human body tissue and the grounding of the body tissue via a supporting leg 11. The sensor electrode 5 therefore forms, with the leg 8, an electrical capacitor (indicated schematically in FIG. 1) whose capacitance changes in a characteristic fashion with the distance of the leg 8 from the sensor electrode 5. The capacitance which is formed by the sensor electrode 5 and ground, in particular the leg 8 of the vehicle user 6 which is located, if appropriate, in the detection area, is referred to below as "capacitance of the sensor electrode 5" for reasons of simplification.

During operation in a continuous measuring process, the sensor unit 1 detects a (capacitance) measurement C, that is to say a variable which is characteristic of the capacitance of the sensor electrode 5. This measuring process is divided into two phases, specifically an energy-saving "low power" mode (referred to below as LP mode) with comparatively low measuring accuracy, and a high resolution "high performance" mode (HP mode) with relatively high measuring accuracy.

In this context, the sensor unit 1 changes automatically and reversibly between the two measuring modes in accordance with the detected capacitance measurement C. During normal operation, consequently in the absence of the leg 8 of the vehicle user 6 which signals the door opening request, and therefore at a comparatively low capacitance, the sensor unit 1 operates in the LP mode. It switches from this LP mode into the HP mode as soon as the capacitance measurement and/or the chronological change therein assume a predefined critical value range. Insofar as the capacitance measurement C which is subsequently determined with a relatively high precision corresponds to a triggering criterion which is stored for the detection of the door opening request, the evaluation unit 2 brings about the activation, that is to say the opening or closing of the tailgate 7, by actuating a servo drive 12. Otherwise, the evaluation unit 2 switches back into the LP mode.

In an alternative embodiment it is possible to provide that the evaluation unit 2 remains in the HP mode until the capacitance of the sensor electrode 5 has dropped below a switch-back value.

In the LP mode, the evaluation unit 2 determines the capacitance measurement C by detecting and evaluating the charging speed of the sensor electrode 5. For this purpose, the evaluation unit 2 switches the pin b into the high-impedance state, with the result that the reference capacitor 4 is not energized.

Figure 3:
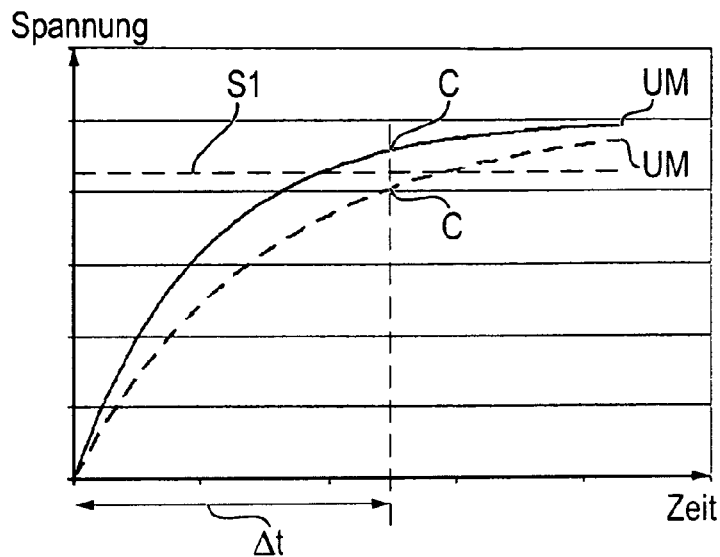
FIG. 3 is a graph showing a time profile of a voltage which drops across the sensor electrode during a first measuring phase of the evaluation unit.

At the start of an LP measuring cycle, the sensor electrode 5 is discharged into the low state by the evaluation unit 2 by switching the pin a, in order to bring about a defined initial state for the measurement and to eliminate any residual charge at the sensor electrode 5. Subsequently, the pin a is switched into the high-impedance state and pin c into the high state. As a result, the sensor electrode 5 is charged via the charging resistor 3, with the result that the (electrode) voltage UM which is present at the sensor electrode 5 gradually rises (FIG. 3). Given a predefined, constant variable of the charging resistor 3, the speed of the rise in the voltage depends on the capacitance of the sensor electrode 5, wherein the value of the voltage UM increases more slowly as a function of the increase in the capacitance.

After expiry of a predefined waiting time $\Delta t$, the evaluation unit 2 taps the voltage UM between the pin a and a ground connection and derives the capacitance measurement C therefrom. In the exemplary embodiment described below, the evaluation unit 2 adopts the measured voltage UM in unmodified form as a capacitance measurement C. In this context, the capacitance measurement C behaves in an opposite way to the actual capacitance of the sensor electrode 5, that is to say decreases with an increase in capacitance. However, it is alternatively also possible to provide that in order to form the capacitance measurement C the evaluation unit 2 multiplies the voltage UM by a predefined factor, inverts, logaritmizes or modifies it in some other way. The capacitance measurement C which is formed in this way is compared by the evaluation unit 2 with a stored (voltage) threshold value S1, wherein this comparison serves as a transition criterion on the basis of which the evaluation unit 2 makes a decision about the changeover into the HP mode.

Given direct adoption of the voltage UM as a capacitance measurement C, the transition criterion is satisfied if the voltage UM undershoots the threshold value S1 (dashed line in FIG. 3) at the end of the waiting time $\Delta t$, owing to comparatively high capacitance and correspondingly slow charging of the sensor electrode 5. In this case, the evaluation unit 2 switches into the HP mode.

If, otherwise, the voltage UM at the end of the waiting time $\Delta t$ has reached the threshold value S1 or exceeded it (unbroken line in FIG. 3) owing to a comparatively small capacitance and correspondingly fast charging of the sensor electrode 5, the evaluation unit 2 remains in the LP mode and begins a new LP measuring cycle of the type described above through renewed discharging of the sensor electrode 5.

In the HP mode, the evaluation unit 2 detects the capacitance of the sensor electrode 5 through a charge transfer process. For this purpose, the pin c is switched into the high-impedance state by the evaluation unit 2, with the result that the resistor 3 is not energized.

The sensor electrode 5 and the reference capacitor 4 are firstly discharged by the evaluation unit 2, by switching both pins a and b into the low state, again in order to bring about certain initial conditions for the measurement.

The pins a and b are subsequently switched in a first transfer step of an HP measuring cycle by the evaluation unit 2 into the high state or the high-impedance state, with the result that the sensor electrode 5 is charged via the pin a. In the charged state, the electrode voltage UM which is present at the sensor electrode 5 corresponds to the operating voltage UB of the evaluation unit 2.

Figure 4:
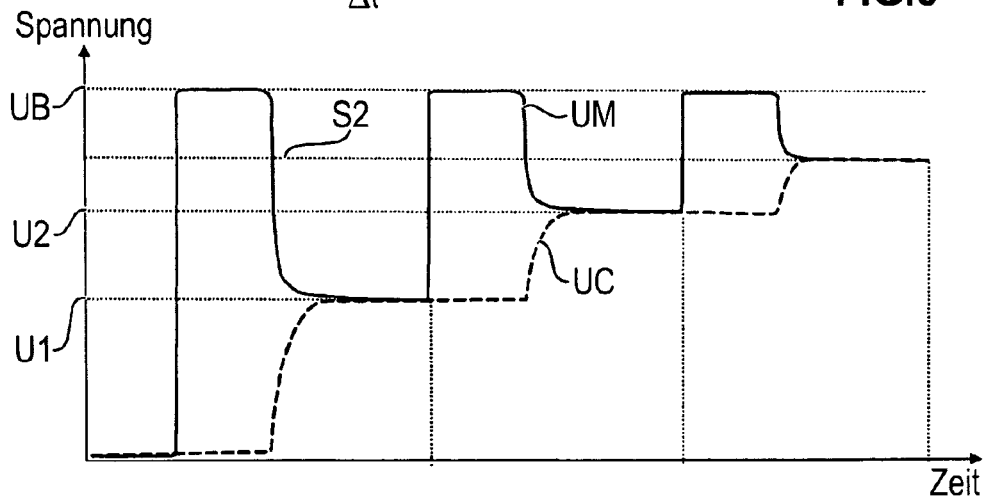
FIG. 4 is a graph showing a simplified time profile of voltages which drop across a reference capacitor and the sensor electrode during a second measuring phase in the absence of a measurement signal which signals a door opening request.
Figure 5:
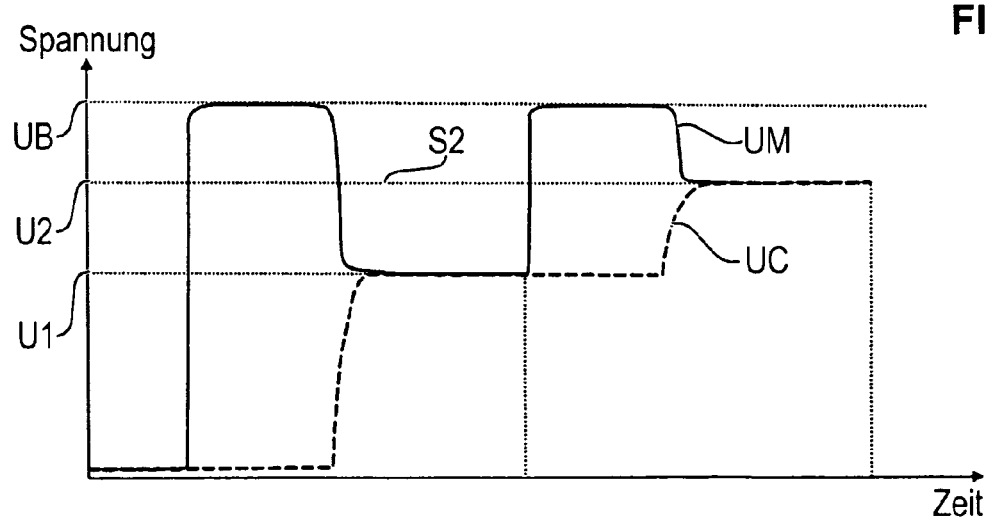
FIG. 5 is a graph according to FIG. 4 showing the time profile of the voltages which drop across the reference capacitor and the sensor electrode, in the case of a measurement signal which signals a door opening request.

After the termination of this charging process, the evaluation unit 2 switches the pins a and b into the high-impedance state or into the low state, with the result that an inflow of charge to the reference capacitor 4 is then made possible. As a result, voltage compensation between the electrode voltage UM and the (capacitor) voltage UC dropping across the reference capacitor 4 takes place until a common equalizing potential U1 is reached (FIGS. 4 and 5).

The capacitor voltage UC is then tapped across the pins a and b by the evaluation unit 2 and compared, as an abort condition, with a (voltage) threshold value S2. If the capacitor voltage UC, corresponding to the equalizing potential U1, undershoots the threshold value S2, the evaluation unit 2 begins a further transfer step by switching over the pins a and b into the high state or the high-impedance state, in the course of which transfer step the capacitor voltage UC reaches an equalizing potential U2 which is relatively high compared to the potential U1 (FIGS. 4 and 5).

The evaluation unit 2 repeats the transfer step here until the abort condition is satisfied, that is to say until the capacitor voltage UC reaches or exceeds the threshold value S2 after the voltage equalization. In contrast to what the schematically simplified voltage profiles according to FIGS. 4 and 5 suggest, during real operation of the sensor unit 1 only small charge quantities are transferred with each transfer step, with the result that the change in the capacitor voltage UC achieved per transfer step turns out to be very small. Therefore, in practice several hundred to thousand transfer steps are typically required to satisfy the abort condition. The number of required transfer steps (charge increase steps) is, however, smaller here, the larger the capacitance of the sensor electrode 5.

In the HP mode, the evaluation unit 2 therefore detects the number of transfer steps carried out within an HP measuring cycle until the abort criterion is satisfied, and determines the capacitance measurement C therefrom. During the exemplary embodiment described below, the evaluation unit 2 adopts the detected number of transfer steps in unmodified form as the capacitance measurement C. The capacitance measurement C therefore also behaves here in a way opposed to the actual capacitance of the sensor electrode 5. Alternatively, it is, however, also possible to provide here that in order to form the capacitance measurement C the evaluation unit 2 multiplies the detected number of transfer steps with a predefined factor, inverts or modifies them in some other way.

The evaluation unit 2 compares the capacitance measurement C, as a triggering criterion, with a predefined triggering threshold value. When the number of transfer steps of the HP measuring cycle is used directly as a capacitance measurement C, this triggering threshold value prescribes a minimum number of transfer steps per measuring cycle. The triggering criterion is satisfied here if the capacitance measurement C undershoots the triggering threshold value.

In the simplified example according to FIGS. 4 and 5, the triggering threshold value is set by way of example to the value 3. The triggering criterion is therefore satisfied here in the case of FIG. 5, while it is not satisfied in the case of FIG. 4. In practice, the triggering threshold value is set, for example, to the value 1000.

When the triggering criterion is satisfied, the evaluation unit 2 outputs a triggering signal A to the servo drive 12 of the tailgate 7, which servo drive subsequently opens or closes the tailgate 7 automatically.

If the triggering criterion is not satisfied, in a first embodiment variant the evaluation unit 2 switches back into the LP mode. In an alternative embodiment variant, when the triggering criterion is not satisfied the evaluation unit 2 firstly starts a new HP measuring cycle, and then does not switch back into the LP mode until the capacitance measurement C exceeds a predefined switch-back value, that is to say until the capacitance of the sensor electrode 5 which is measured indirectly by the capacitance measurement C has dropped sufficiently again.

In a further variant of the control software which is implemented in the evaluation unit 2, the evaluation unit 2 always carries out a defined number of transfer steps per HP measuring cycle, and determines the capacitance measurement C from the equalizing potential to which the capacitor voltage UC is set after the conclusion of the last transfer step. In this case, the evaluation unit 2 triggers the opening or closing of the tailgate 7 when the capacitance measurement C exceeds a predefined triggering threshold value.

In order to rule out incorrect triggering of the sensor unit 1 by unauthorized persons, or for example animals, the sensor unit 1 is preferably coupled to a fully automatically opening door lock system ("Keyless Go"), which enables activation of the tailgate 7 only if the door lock system is unlocked, for example by a radio transmitter in the key of the vehicle user 6.

Instead of simple threshold value comparisons, relatively complex patterns can also be provided for the transition criterion of the first measuring phase or the triggering criterion of the second measuring phase. For example, it is possible to stipulate as a transition criterion that the electrode voltage UM must repeatedly not reach the voltage threshold value S1 in directly successive LP measuring cycles. Whether the transition criterion or triggering criterion is satisfied or not satisfied can additionally also be tested by a neural network or by fuzzy logic.

To summarize, a method for measuring a capacitance is specified. In the method, during a first measuring phase a first detection measurement of the capacitance to be measured is detected by a first measuring method. A second measuring phase is started here when the first detection measurement satisfies a transition criterion. During the second measuring phase, a second detection measurement of the capacitance to be measured is detected by a second measuring method which is different from the first measuring method. The second measuring method has a higher measuring accuracy compared to the first measuring method but also involves greater expenditure of energy.

The invention claimed is:
1. A method for measuring a capacitance, which comprises the steps of:
   during a first measuring phase, detecting a first measured quantity of the capacitance via a first measuring method, the first measuring method includes performing one of the further steps for detecting the first measured quantity:
      detecting a measurement of a charging speed of a sensor electrode;

detecting an amplitude of an alternating voltage present on a voltage divider containing a sensor electrode; or detecting a phase angle between the alternating voltage and a strength of a flow of current caused by the alternating voltage;

starting a second measuring phase when the first measured quantity satisfies a transition criterion; and during the second measuring phase, detecting a second measured quantity of the capacitance to be measured via a second measuring method being different from the first measuring method, the second measuring method having a higher level of measuring accuracy compared to the first measuring method, and the first measuring method having a lower expenditure of energy compared to the second measuring method, the second measuring method includes performing one of the further steps of:

detecting a measurement of a charge quantity on the sensor electrode as the second measured quantity; or detecting a frequency of a voltage which is generated by an RC oscillator containing the sensor electrode.

2. The method according to claim 1, which further comprises:

defining the transition criterion to contain a threshold value comparison of the first measured quantity with a given threshold value; and detecting an electrical voltage dropping across the sensor electrode or a charging resistor connected upstream as the first measured quantity and the transition criterion is met when the first measured quantity does not reach the given threshold value in a predefined time frame.

3. The method according to claim 1, which further comprises:

detecting, during the second measuring phase, a capacitor voltage present at a reference capacitor owing to a transfer of charge from the sensor electrode to the reference capacitor;

increasing a charge quantity at the reference capacitor incrementally until the capacitor voltage reaches a predefined limiting value; and detecting a number of charge increasing increments as the second measured quantity.

4. The method according to claim 1, which further comprises:

during the second measuring phase, transferring charge incrementally from the sensor electrode to a reference capacitor and is accumulated at the reference capacitor; and detecting, after a number of charge increasing increments, a capacitor voltage present at the reference capacitor, and the capacitor voltage is detected as the second measured quantity.

5. The method according to claim 1, wherein in order to determine a basic measurement of capacitance, alternating switching occurs between the first measuring phase and the second measuring phase in a timing pattern.

6. A detection method, which comprises the steps of:

detecting a door opening request of a motor vehicle user in a motor vehicle via a capacitive sensor unit which measures a capacitance, by the further steps of:

during a first measuring phase, detecting a first measured quantity of the capacitance to be measured via a first measuring method, the first measuring method includes performing one of the further steps for detecting the first measured quantity:

detecting a measurement of a charging speed of a sensor electrode;

detecting an amplitude of an alternating voltage present on a voltage divider containing a sensor electrode; or detecting a phase angle between the alternating voltage and a strength of a flow of current caused by the alternating voltage;

starting a second measuring phase when the first measured quantity satisfies a transition criterion; and during the second measuring phase, detecting a second measured quantity of the capacitance to be measured via a second measuring method which is different from the first measuring method, the second measuring method having a higher level of measuring accuracy compared to the first measuring method, and the first measuring method having a lower expenditure of energy compared to the second measuring method, the second measuring method includes performing one of the further steps of:

detecting a measurement of a charge quantity on the sensor electrode as the second measured quantity; or detecting a frequency of a voltage which is generated by an RC oscillator containing the sensor electrode.

7. A capacitive sensor unit, comprising:

a sensor electrode;

an evaluation unit;

a charging resistor; and a reference capacitor, said sensor electrode, said evaluation unit, said charging resistor and said reference capacitor coupled or can be coupled to each other via signaling technology;

said evaluation unit configured and programmed to measure a capacitance by the steps of:

during a first measuring phase, detecting a first measured quantity of the capacitance to be measured via a first measuring method, the first measuring method includes performing one of the further steps for detecting the first measured quantity:

detecting a measurement of a charging speed of said sensor electrode as the first measured quantity;

detecting an amplitude of an alternating voltage present on a voltage divider containing a sensor electrode; or detecting a phase angle between the alternating voltage and a strength of a flow of current caused by the alternating voltage;

starting a second measuring phase when the first measured quantity satisfies a transition criterion; and during the second measuring phase, detecting a second measured quantity of the capacitance to be measured via a second measuring method which is different from the first measuring method, the second measuring method having a higher level of measuring accuracy compared to the first measuring method, and the first measuring method having a lower expenditure of energy compared to the second measuring method, the second measuring method includes performing one of the further steps of:

detecting a measurement of a charge quantity on the sensor electrode as the second measured quantity; or detecting a frequency of a voltage which is generated by an RC oscillator containing the sensor electrode.

* * * * *